US012598845B2

(12) United States Patent
Odnoblyudov

(10) Patent No.: US 12,598,845 B2
(45) Date of Patent: *Apr. 7, 2026

(54) SOLID STATE OPTOELECTRONIC DEVICE WITH PREFORMED METAL SUPPORT SUBSTRATE

(71) Applicant: Micron Technology, Inc., Boise, ID (US)

(72) Inventor: Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 922 days.

This patent is subject to a terminal disclaimer.

(21) Appl. No.: 17/140,873

(22) Filed: Jan. 4, 2021

(65) Prior Publication Data

US 2021/0126177 A1     Apr. 29, 2021

Related U.S. Application Data

(60) Continuation of application No. 16/268,670, filed on Feb. 6, 2019, now Pat. No. 10,886,444, which is a continuation of application No. 15/699,144, filed on Sep. 8, 2017, now Pat. No. 10,249,806, which is a continuation of application No. 15/137,913, filed on Apr. 25, 2016, now Pat. No. 9,768,366, which is a division of application No. 13/048,656, filed on Mar. 15, 2011, now Pat. No. 9,324,905.

(51) Int. Cl.
*H10H 20/857*     (2025.01)
*H10H 20/01*     (2025.01)
*H10H 29/14*     (2025.01)

(52) U.S. Cl.
CPC ........ *H10H 20/857* (2025.01); *H10H 20/018* (2025.01); *H10H 29/142* (2025.01); *H01L 2224/48091* (2013.01); *H01L 2224/73265* (2013.01); *H01L 2924/12044* (2013.01)

(58) Field of Classification Search
CPC ... H01L 33/62; H01L 33/0093; H10H 20/018; H10H 20/857
See application file for complete search history.

(56) References Cited

U.S. PATENT DOCUMENTS

| | | |
|---|---|---|
| 7,148,075 B2 | 12/2006 | Peng et al. |
| 7,384,807 B2 | 6/2008 | Yoo |
| 7,465,592 B2 | 12/2008 | Yoo |
| 9,324,905 B2 | 4/2016 | Odnoblyudov |
| 9,768,366 B2 * | 9/2017 | Odnoblyudov ......... H01L 33/62 |
| 2005/0072983 A1 | 4/2005 | Chang et al. |

(Continued)

FOREIGN PATENT DOCUMENTS

WO     WO-2009145483 A2 * 12/2009     ......... H01L 33/0079

*Primary Examiner* — Vu A Vu
*Assistant Examiner* — Valerie N Newton
(74) *Attorney, Agent, or Firm* — Dorsey & Whitney LLP

(57)     ABSTRACT

A wafer-level process for manufacturing solid state lighting ("SSL") devices using large-diameter preformed metal substrates is disclosed. A light emitting structure is formed on a growth substrate, and a preformed metal substrate is bonded to the light emitting structure opposite the growth substrate. The preformed metal substrate can be bonded to the light emitting structure via a metal-metal bond, such as a copper-copper bond, or with an inter-metallic compound bond.

16 Claims, 9 Drawing Sheets

(56)        References Cited

U.S. PATENT DOCUMENTS

| | | | |
|---|---|---|---|
| 2006/0006554 A1 | 1/2006 | Yoo et al. | |
| 2007/0048887 A1 | 3/2007 | Erlach et al. | |
| 2008/0303157 A1* | 12/2008 | Cheng | H01L 24/97 |
| | | | 257/E23.141 |
| 2009/0278150 A1 | 11/2009 | Lee et al. | |
| 2010/0197534 A1* | 8/2010 | Yuasa | B22F 7/004 |
| | | | 428/550 |
| 2011/0012263 A1 | 1/2011 | Hata et al. | |
| 2011/0091351 A1* | 4/2011 | Long | C22C 12/00 |
| | | | 420/557 |
| 2011/0140076 A1 | 6/2011 | Song | |
| 2011/0183464 A1 | 7/2011 | Takahashi et al. | |
| 2011/0233580 A1 | 9/2011 | Bierhuizen et al. | |
| 2011/0318549 A1 | 12/2011 | Schmidt et al. | |
| 2012/0175774 A1 | 7/2012 | West et al. | |
| 2012/0235167 A1 | 9/2012 | Odnoblyudov et al. | |
| 2013/0240936 A1* | 9/2013 | Seo | H01L 33/30 |
| | | | 257/98 |
| 2016/0343925 A1 | 11/2016 | Odnoblyudov et al. | |
| 2018/0013044 A1 | 1/2018 | Odnoblyudov | |
| 2019/0181318 A1 | 6/2019 | Odnoblyudov | |

* cited by examiner

SOLID STATE OPTOELECTRONIC DEVICE WITH PREFORMED METAL SUPPORT SUBSTRATE

CROSS-REFERENCE TO RELATED APPLICATION(S)

This application is a continuation of U.S. application Ser. No. 16/268,670, filed Feb. 6, 2019, now U.S. Pat. No. 10,886,444; which is a continuation of U.S. application Ser. No. 15/699,144, filed Sep. 8, 2017, now U.S. Pat. No. 10,249,806; which is a continuation of U.S. application Ser. No. 15/137,913, filed Apr. 25, 2016, now U.S. Pat. No. 9,768,366; which is a divisional of U.S. application Ser. No. 13/048,656, filed Mar. 15, 2011, now U.S. Pat. No. 9,324,905, each of which is incorporated herein by reference in its entirety.

TECHNICAL FIELD

The present technology is directed to solid state lighting ("SSL") devices constructed on large-diameter wafers (e.g., greater than 4 inches) with a preformed metal support substrate.

BACKGROUND

SSL devices generally use semiconductor light emitting diodes ("LEDs") and/or polymer light emitting diodes ("PLEDs") as sources of illumination rather than electrical filaments, a plasma, or a gas. Mobile phones, laptop computers, digital cameras, MP3 players, and other portable electronic devices can utilize SSL devices for background illumination. SSL devices can also be used for signage, indoor lighting, outdoor lighting, and other types of general illumination.

FIG. 1 shows a conventional vertical SSL device 10 including a light emitting structure 17 having a p-type gallium nitride (GaN) 12, GaN/indium gallium nitride (InGaN) multiple quantum wells (MQW) 14, and an n-type GaN 16 in series. The SSL device 10 also includes a support substrate 18 and a p-type contact 20 between the support substrate 18 and the p-type GaN 12. Conventional support substrates 18 are typically sapphire or a semiconductor material having a wafer form factor. The SSL device 10 also includes an n-type contact 22 on top of the SSL device 20 that can be wirebonded to an external contact 24. The SSL device 10 can be mounted to an external host device 26. As a voltage is applied between the n-type contact 22 and the p-type contact 20, electrical current passes through the light emitting structure 17 and produces light. The SSL device 10 can be made on a wafer that is singulated into individual SSL devices.

Conventional devices use thermo-compression bonding, such as copper-copper (Cu—Cu) bonding, or eutectic bonding (AuSn), or intermetallic compound (IMC) bonding (NiSn), to attach the light emitting structure 17 to the support substrate 18. This process requires high temperatures and pressures that can bow or deform the wafer to such an extent that it cracks or warps. Currently LED industry is mostly working with 2-4 inch diameter substrates, which limits the throughput and increases costs because fewer SSL devices can be produced on such small wafers. Even at these diameters warp and bow of the wafers is a problem for fabrication of LEDs. This problem becomes severe for large diameter (>4 inch) wafers.

DETAILED DESCRIPTION

Various embodiments of SSL devices, assemblies, and methods of manufacturing are described below. As used hereinafter, the term "SSL device" generally refers to devices with LEDs, laser diodes ("LDs"), PLEDs, organic light emitting diodes ("OLEDs"), and/or other suitable light emitting structures other than electrical filaments, a plasma, or a gas. A person skilled in the relevant art will also understand that the technology may have additional embodiments and that the technology may be practiced without several of the details of the embodiments described below with reference to FIGS. 2-14.

Figure 1:
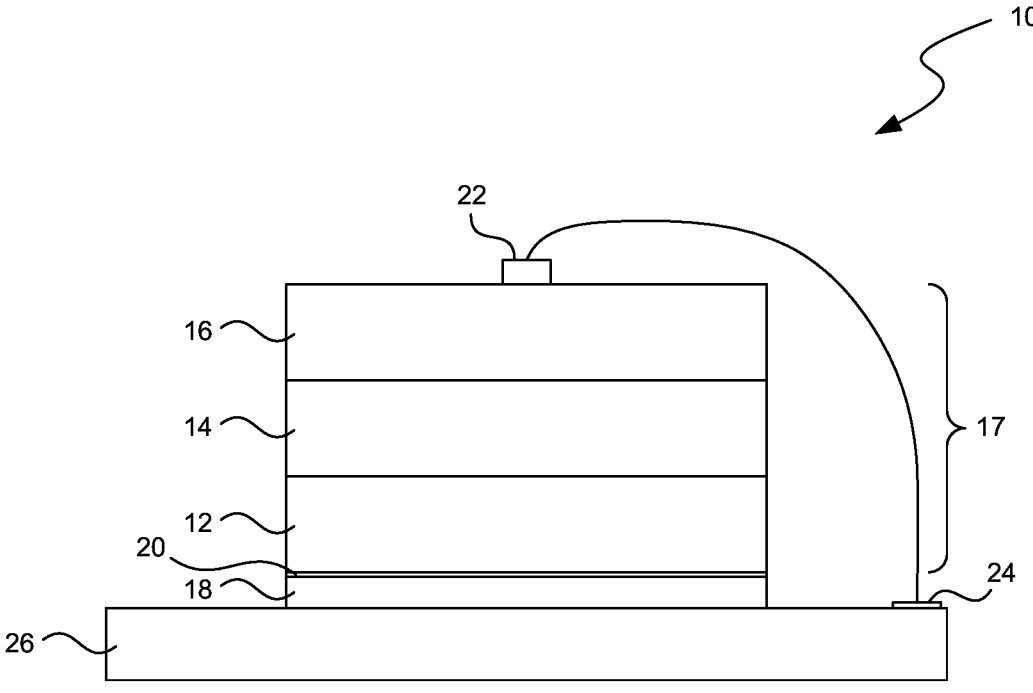
FIG. 1 illustrates a vertical SSL device according to the prior art.
Figure 2:
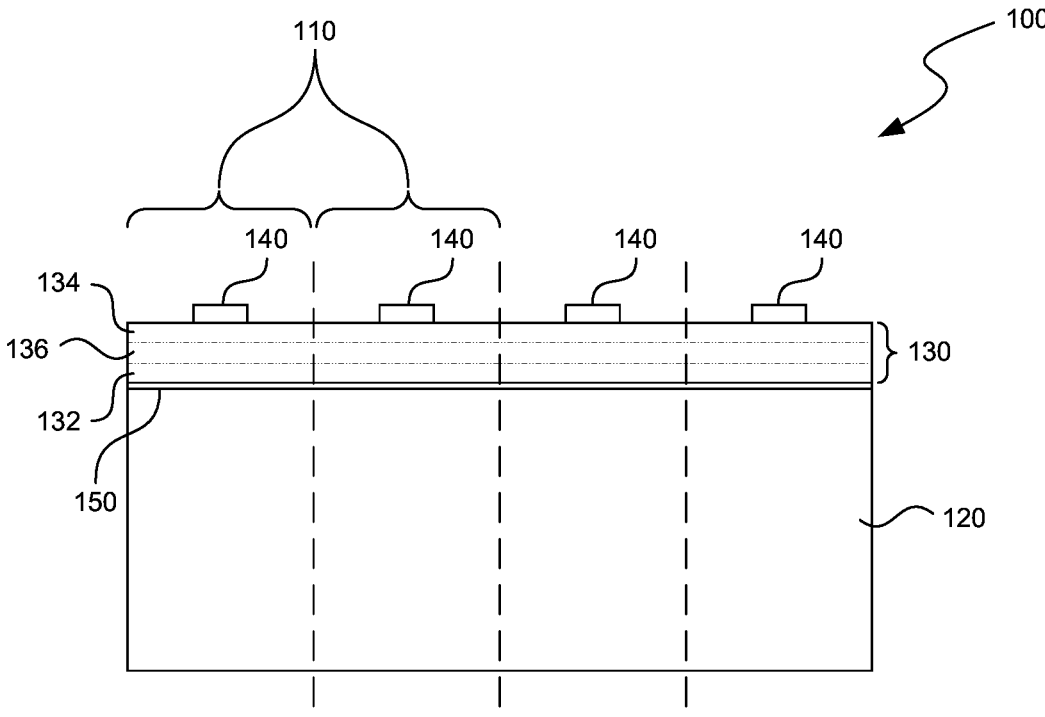
FIG. 2 illustrates a wafer comprising several SSL devices that include a light emitting structure and a preformed metal substrate according to an embodiment of the present technology.

FIG. 2 illustrates a wafer 100 comprising a plurality of SSL devices 110 formed at the wafer level according to selected embodiments of the present technology. It is to be appreciated that some of the processes described herein can be selectively applied to portions of the wafer 100 or to the entire wafer 100. The wafer 100 can have a generally circular shape with a diameter of at least four inches, and in many embodiments the wafer diameter can be 6-8 inches or larger. In selected embodiments, the wafer 100 includes a preformed metal substrate 120 bonded to a light emitting structure 130 and an exterior contact 140 on the light emitting structure 130. As explained in more detail below, the preformed metal substrate 120 can be a metal blank or plate that is formed apart from the light emitting structure 130 and then bonded to the light emitting structure 130. The preformed metal substrate 120 has a sufficient thickness to inhibit bowing of the light emitting structure 130. For example, when the light emitting structure 130 has a diameter of at least 100 mm (e.g., 100 mm, 150 mm, 200 mm, 300 mm, or more), the preformed metal substrate 120 alone without another carrier or support substrate can inhibit bowing at the center of the wafer 100 to less than about 10 μm-100 mm, or less than about one of 500 μm, 100 μm, 50 μm, 20 μm, 10 μm or 5 μm (e.g., 0.001% to 1%).

The preformed metal substrate 120 can be electrically and thermally conductive. For example, the preformed metal substrate 120 can be an elemental metal, an alloy of different metals, or a plurality of non-alloyed metals. In one embodiment, the preformed metal substrate 120 includes copper, a copper alloy, aluminum, and/or other metals.

The light emitting structure 130 can be an LED, a PLED, an OLED, or another solid state structure that includes a first semiconductor material 132, a second semiconductor material 134, and an active region 136 between the first semiconductor material 132 and the second semiconductor material 134. In one embodiment, the first and second semiconductor materials 132 and 134 include a p-type GaN material and an n-type GaN material, respectively. In another embodiment, the first and second semiconductor materials 132 and 134 include an n-type GaN material and a p-type GaN material, respectively. In further embodiments, the first and second semiconductor materials 132 and 134 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), aluminum gallium nitride (AlGaN), and/or other suitable semiconductor materials.

The active region 136 can include a single quantum well ("SQW"), multiple quantum wells ("MQWs"), and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 136 can include an InGaN SQW, InGaN/GaN MQWs, and/or an InGaN bulk material. In other embodiments, the active region 136 can include aluminum gallium indium phosphide (AlGaInP), aluminum gallium indium nitride (AlGaInN), and/or other suitable materials or configurations. In any of the foregoing embodiments, the first semiconductor material 132, the active region 136, the second semiconductor material 134, and any buffer materials (not shown) can be formed via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques.

The wafer 100 can also have an electrode 150 electrically coupled to the first semiconductor material 132. In other embodiments, the electrode 150 can be omitted and a portion of the preformed metal substrate 120 can be used as an electrode lead electrically coupled to the first semiconductor material 132. The exterior contact 140 and light emitting structure 130 can form a vertically oriented SSL device 110 as defined above. In many configurations, the p-type components and the n-type components are transposed, and the SSL devices 110 can have other configurations, such as lateral configurations.

Figure 3:
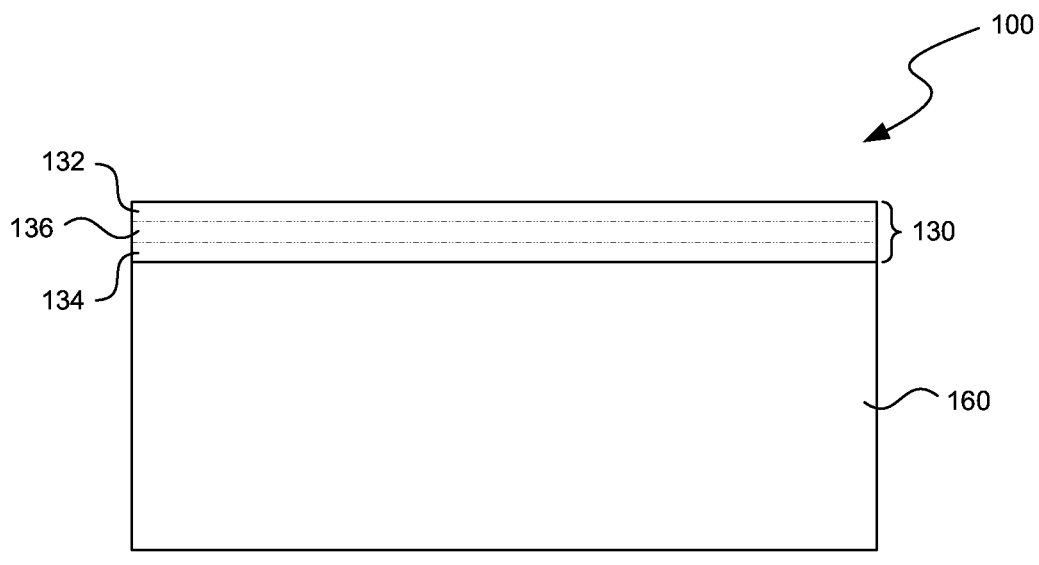
FIG. 3 illustrates a growth substrate and a light emitting structure for a wafer according to an embodiment of the present technology.

FIGS. 3-8 illustrate methods and procedures for forming the wafer 100 according to selected embodiments of the present technology. At the stage shown in FIG. 3, the wafer 100 includes a growth substrate 160 and the light emitting structure 130 on the growth substrate 160. The growth substrate 160 can include silicon (Si) with a Si(1,1,1) crystal orientation at the surface upon which the light emitting structure 130 is formed. In other embodiments, the growth substrate can include AlGaN, GaN, silicon carbide (SiC), sapphire (Al₂O₃), an engineered substrate, a combination of the foregoing materials, and/or other suitable substrate materials. The light emitting structure 130 can be the same as described above in FIG. 2. In the embodiment of FIG. 3, the second semiconductor material 134 is grown on or proximate the growth substrate 160, and then the active region 136 and first semiconductor material 132 are then grown sequentially.

Figure 4:
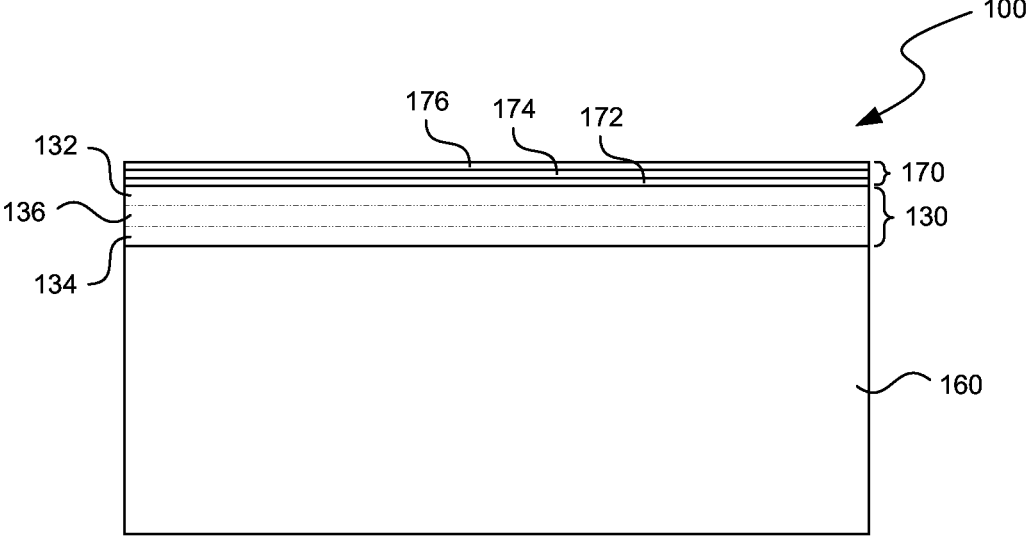
FIG. 4 illustrates a wafer including a light emitting structure having metal bonding materials deposited on the light emitting structure according to an embodiment of the present technology.

FIG. 4 illustrates a further stage of the method according to the present technology after a metal bonding structure 170 is formed on the light emitting structure 130. In selected embodiments, the metal bonding structure 170 comprises a metal stack that forms an embedded electrode (e.g., embedded electrode 150 shown in FIG. 2) and/or provides a barrier material and/or reflective material. The metal bonding structure 170 can also have a copper seed material deposited on the metal stack. The copper seed material can later be used to form an additional metal structure on the seed material through a process such as electroplating. For example, the metal bonding structure 170 can include a reflective material 172 (e.g., silver (Ag) or aluminum (Al)), a barrier material 174 (e.g., tungsten titanium (WTi) or tantalum nitride (TaN)), and a copper seed layer 176. Other suitable metals can be used, and the metal bonding structure 170 can be formed using suitable techniques known in the art.

Figure 5:
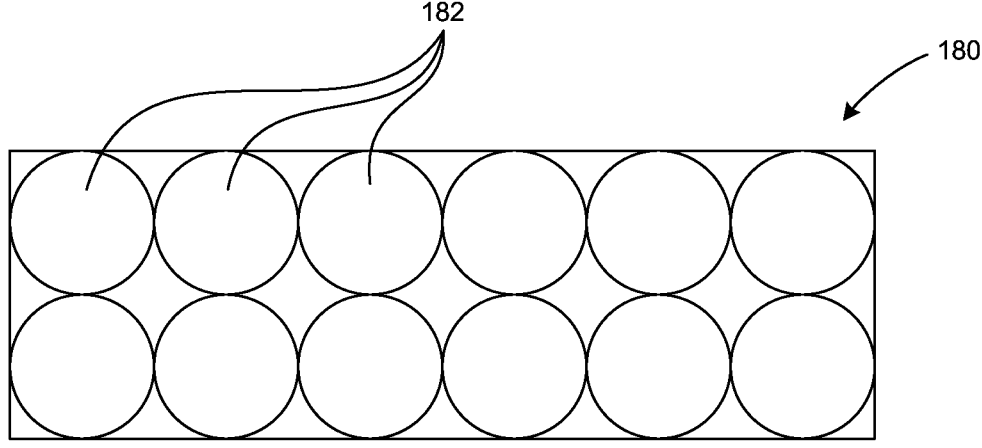
FIG. 5 illustrates a sheet of material having wafer-sized circular blanks stamped from the sheet.

FIG. 5 illustrates a separate stage performed apart from forming the light emitting structure 130 in which a metal sheet 180, such as a copper sheet, is stamped or otherwise fabricated to form a plurality of metal blanks 182 that have approximately the same diameter or other form factor dimension as the wafer 100. After being fabricated from the sheet, each metal blank 182 can define an individual preformed metal substrate configured to be attached to a light emitting structure, such as the preformed metal substrate 120 shown in FIG. 2. The pattern of the metal blanks 182 relative to the sheet 180 can vary, and the metal blanks 182 can be formed individually rather than being fabricated from a sheet. The metal blanks 182 can be formed to have sufficient thickness to support and inhibit bowing of the light emitting structure 130. In selected embodiments, the thickness of the metal blanks 182 can be approximately, for example, 50-300 μm, 150-300 μm, 100-150 μm, or 75-150 μm. In selected embodiments, the metal blanks 182 are thick enough to be handled and incorporated into the wafer 100 without bowing and without being supported by another support structure.

Figure 6:
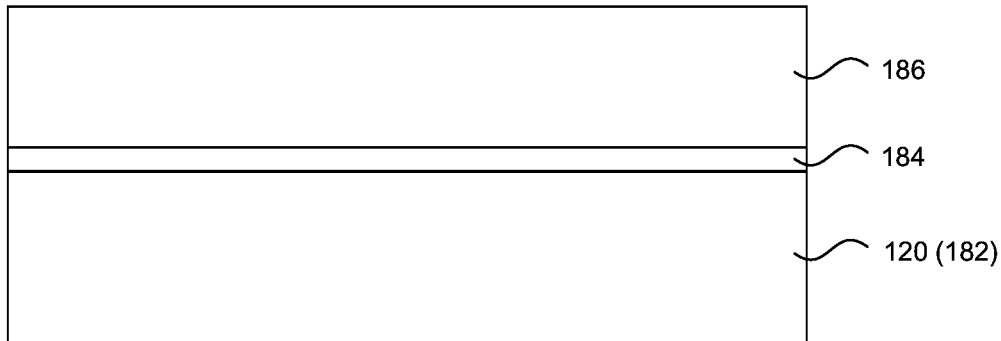
FIG. 6 illustrates a preformed metal substrate and temporary carrier according to an embodiment of the present technology.

FIG. 6 illustrates an embodiment of a preformed metal substrate 120 made from a metal blank 182 that has been attached to a temporary carrier 186 by an adhesive 184. The temporary carrier 186 is preferable for thinner preformed metal substrates 120 that are difficult to handle due to their size. The temporary carrier 186 can be made of an inexpensive material, such as silicon or a carrier tape, that can be reused and/or recycled.

Figure 7:
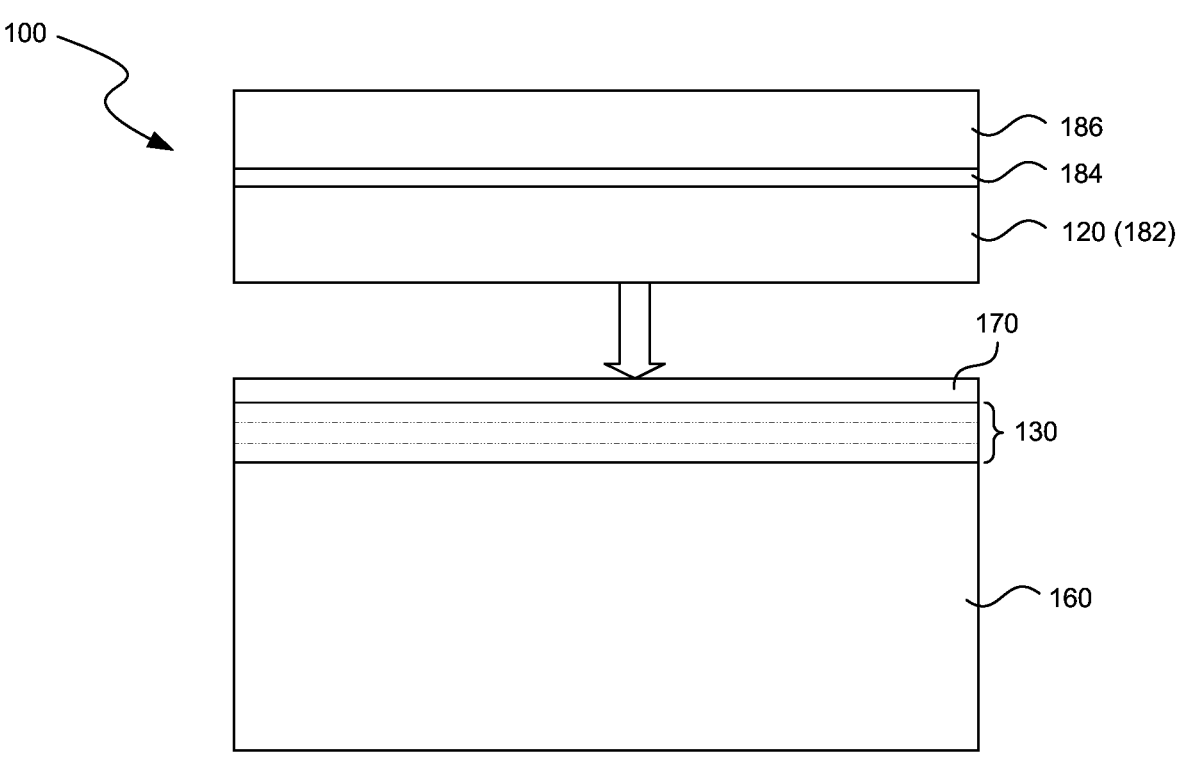
FIG. 7 illustrates a preformed metal substrate being bonded to a wafer according to an embodiment of the present technology.

FIG. 7 shows a further stage in which the preformed metal substrate 120 is bonded to the metal bonding structure 170 using a metal-metal bond. In embodiments in which the metal bonding structure 170 and the preformed metal substrate 120 both include copper, the two metals can be bonded together with a copper-copper (Cu—Cu) bond. The metal bonding structure 170 and the preformed metal substrate 120 can also each include materials for forming an intermetallic compound (IMC) or eutectic bond. These embodiments are discussed in more detail below.

Figure 8:
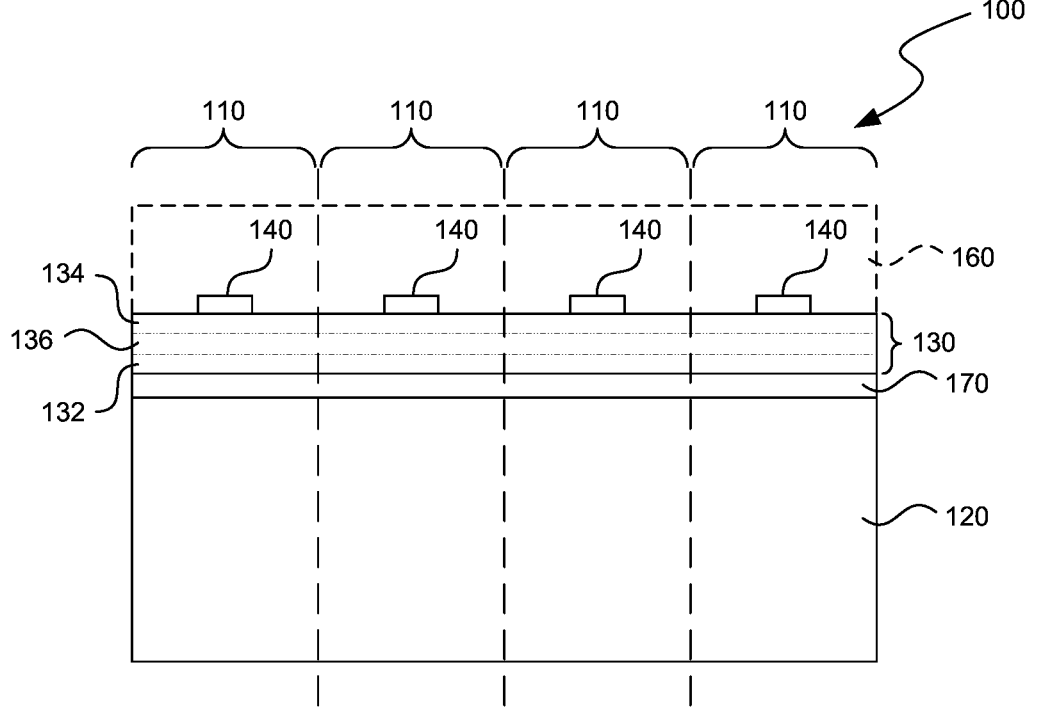
FIG. 8 illustrates a wafer having a preformed metal substrate and light emitting structure according to an embodiment of the present technology.

FIG. 8 illustrates the wafer 100 in an inverted orientation after the preformed metal substrate 120 and the metal bonding structure 170 have been bonded together such that the preformed metal substrate 120 is at the base of the wafer 100. The growth substrate 160 (shown in phantom) can be removed from the light emitting structure 130 by grinding, post-grinding, wet etching, dry etching, or another suitable process. The exterior contact 140 can be formed on the light emitting structure 130 using a suitable metal evaporation and patterning technique. The exterior contacts 140 can be patterned as needed, and each SSL device 110 can have one or more exterior contacts 140. For embodiments in which the second semiconductor material 134 includes N—GaN, the exterior contacts 140 can be made of a titanium-aluminum stack (e.g., Ti/Al or Al/Ti/Al). The wafer 100 can be further processed in an annealing step and with a surface-roughening procedure. The temporary carrier 186 (not shown in FIG. 8) can be removed from the wafer 100 using similar processes that were used to remove the growth substrate 160, or thermal debonding, or in the case of a tape the temporary carrier 186 can be peeled off of the wafer 100.

In selected embodiments, the metal-metal bond between the preformed metal substrate 120 and the metal bonding structure 170 can be made at a suitable temperature to avoid harming any existing bonds or other structures on the wafer 100. Also, some temporary bonds made at one temperature can be debonded at a different temperature. This characteristic is used advantageously in several embodiments of methods in accordance with the present technology. For example, the preformed metal substrate 120 can be bonded to the temporary carrier 186 at a first temperature (T₁) and debonded at a second temperature (T₂). In several applications, T₁ can be approximately the same as T₂. The preformed metal substrate 120 can also be bonded to the light emitting structure 130 at a third temperature (T₃) and debonded at a fourth temperature (T₄). In one embodiment, the bonding temperature T₃ between the preformed metal substrate 120 and the light emitting structure 130 is less than the debonding temperature T₂ between the preformed metal substrate 120 and the temporary carrier 186 so that bonding the preformed metal substrate 120 to the light emitting structure 130 does not debond the preformed metal substrate 120 from the temporary carrier 186. Additionally, the debonding temperature T₂ between the preformed metal substrate 120 and the temporary carrier 186 is less than the debonding temperature T₄ between the light emitting structure 130 and the preformed metal substrate 120 so that the temporary carrier 186 can be removed without debonding the preformed metal substrate 120 from the light emitting structure 130. As such, in this embodiment, T₃<T₂<T₄. The materials and bonding processes should be selected to satisfy these conditions.

One specific example that meets these conditions, which is not intended to be limiting, uses a high-temperature thermoplastic temporary bond for bonding the preformed metal substrate 120 to the temporary carrier 186. The thermoplastic temporary bond material can be polyether-etherkeytone (PEEK) or a PEEK-based material with a melting point greater than about 320° C. The metal-metal bonds, such as between the metal bonding structure 170 and the preformed metal substrate 120, can be made as temporary liquid phase ("TLP") bonds. Examples of bonding materials that satisfy the above-noted constraints are nickel-tin (NiSn, bonds at 300° C., remelts at 796° C.), indium-gold (InAu, bonds at 200° C., remelts at 580° C.), and copper-tin (CuSn, bonds at 250° C., remelts at 415° C.). Other temporary and metal-metal bonds can be used as well. In embodiments in which a high temperature bonding process does not put other bonds at risk, such as when the temporary carrier 186 is not used, any conventional bonding process can be used to bond the metal bonding structure 170 to the preformed metal substrate 120. For example, a high-temperature copper-copper (CuCu), nickel-tin (NiSn), gold-tin (AuSn), copper-tin (CuSn), or other metal bonds can be used without risking harm to the bond between the preformed metal substrate 120 and the temporary carrier 186.

Figure 9:
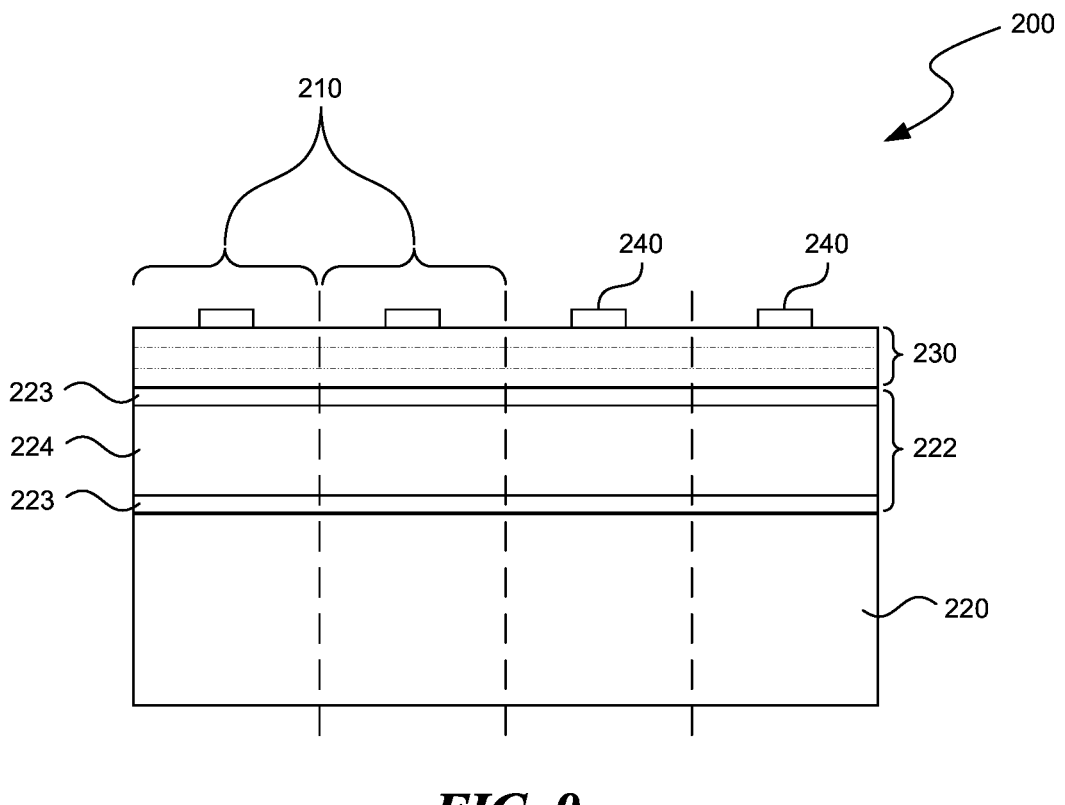
FIG. 9 illustrates a preformed metal substrate bonded to a light emitting structure via an inter-metallic compound ("IMC") bond according to an embodiment of the present technology.

FIG. 9 illustrates an embodiment of another method in accordance with the present technology. In selected embodiments, a wafer 200 comprises a preformed metal substrate 220, an IMC bond 222, a light emitting structure 230, and exterior contacts 240 formed over individual SSL devices 210 of the wafer 200. Portions of the preformed metal substrate 220 can be used as a base contact for the light emitting structure 230. The wafer 200 can be circular having a diameter of at least four inches, and in many cases 6-8 inches or more.

The IMC bond 222 can be made of two materials that bond together to form a metal structure containing an alloy of the two materials. The IMC bond 222 can have one boundary region 223 proximate to the preformed metal substrate 220, another boundary region 223 proximate the light emitting structure 230, and a median region 224 between the two boundary regions 223. The boundary region 223 can have a higher concentration of one of the two materials of the IMC bond 222 compared to the median region 224. The median region 224 can be an alloy or a more uniform mixture of the metals. The resultant bond is strong and relatively inexpensive to produce.

Figure 10:
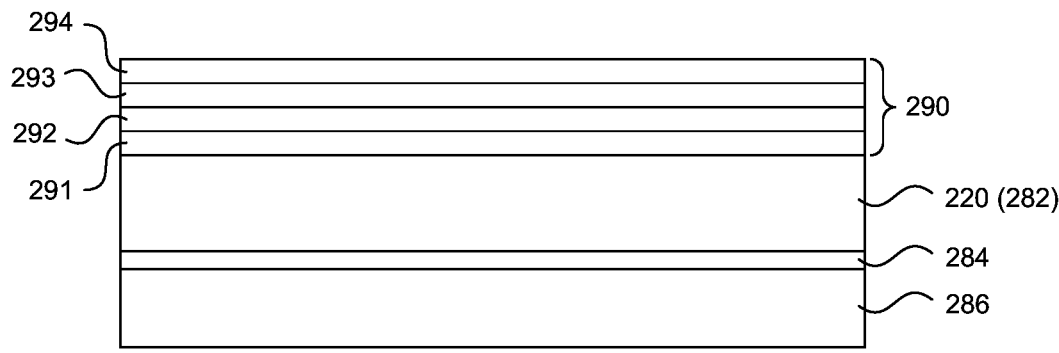
FIG. 10 illustrates a preformed metal substrate having an IMC stack formed thereon according to an embodiment of the present technology.

FIGS. 10-14 illustrate selected stages of a process for manufacturing the wafer 200 according to embodiments of the present technology. FIG. 10 shows a preformed metal blank 282 that defines the preformed metal substrate 220 (FIG. 9) attached to a temporary carrier 286. The preformed metal substrate 220 can be stamped or otherwise fabricated from a material to have a diameter or other form factor dimension that substantially matches that of the wafer 200. The preformed metal substrate 220 can be attached to the temporary carrier 286 with an adhesive 284 or by another suitable means, such as a PEEK bond. The temporary carrier 286 may be used when the preformed metal substrate 220 is not sufficiently thick to be handled safely without support. The preformed metal substrate 220 can have a seed material (not shown) deposited on a surface opposite the temporary carrier 286. Additional bonding materials 290 can be plated or otherwise deposited on the seed material. In selected embodiments, the bonding materials 290 comprise sequentially plated IMC bonding materials of a first nickel 291, a first tin 292, a second tin 293, and a second nickel 294. Other combinations of IMC materials can be used. The relative thicknesses of the various bonding materials 290 can be designed to minimize lateral strain caused by the disparate properties of the adjacent materials. For example, because some materials tend to expand or contract during the IMC process, by creating the stack of bonding materials 290 having the right mixture of contracting and expanding materials can reduce lateral strain and bowing of the wafer 200.

Figure 11:
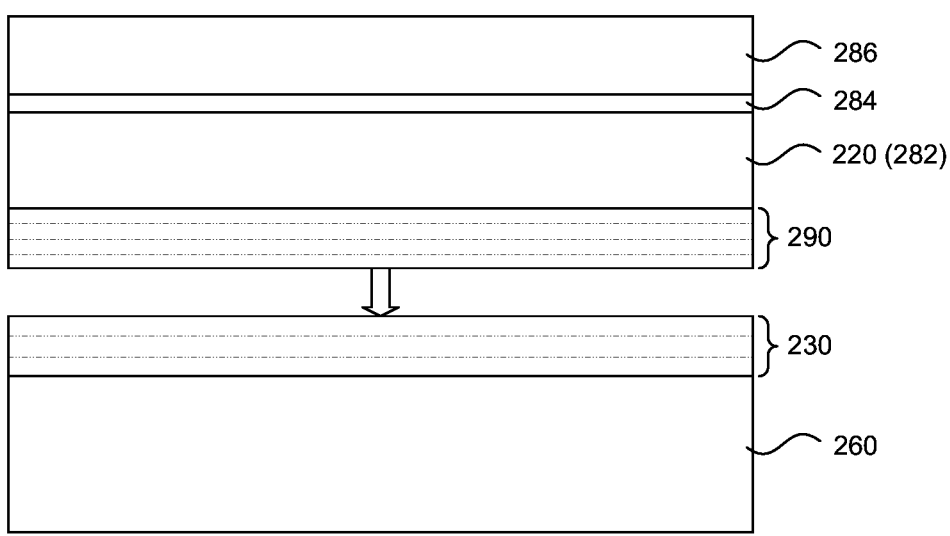
FIG. 11 illustrates the preformed metal substrate of FIG. 10 being bonded to a light emitting structure of a wafer according to an embodiment of the present technology.

FIG. 11 shows a stage of the processes of the present technology in which the light emitting structure 230 is bonded to the preformed metal substrate 220. The light emitting structure 230 can have a thin metal structure (not shown) which in turn can be bonded to the IMC stack of bonding materials 290. The orientation of the preformed metal substrate 220 and temporary carrier 286 (if present) is such that the preformed metal substrate 220 is proximate to the light emitting structure 230 and the temporary carrier 286 is positioned distally away from the light emitting structure 230. The temporary carrier 286 and a growth substrate 260 can then be removed, exterior contacts (shown in FIG. 9) can be formed, and the SSL devices 210 can be singulated from each other.

Figure 12:
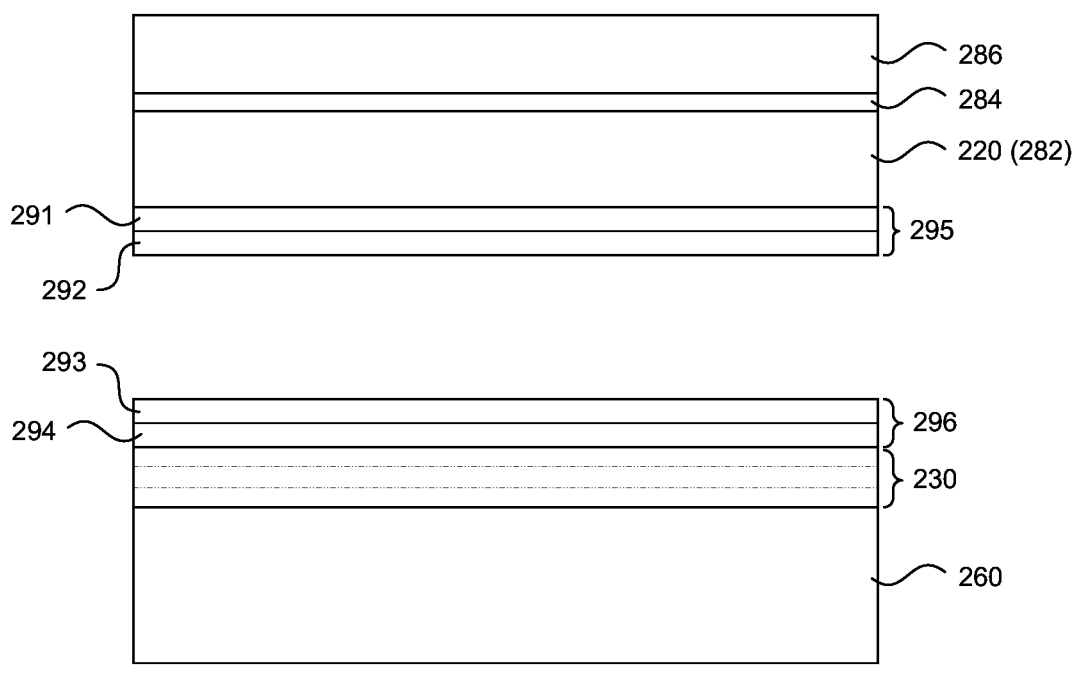
FIG. 12 illustrates a preformed metal substrate having first IMC components formed thereon and a light emitting structure having second IMC components formed thereon according to an embodiment of the present technology.

FIG. 12 illustrates another embodiment of the technology in which the bonding materials are formed in two portions: a first portion 295 on the preformed metal substrate 220 and a second portion 296 on the light emitting structure 230. In selected embodiments, the first portion 295 includes the first nickel 291 and the first tin 292, and the second portion 296 includes the second tin 293 and the second nickel 294. IMC bonding can include a broad range of different materials; the examples given here are not intended to limit the scope of the technology to the materials specifically described herein.

Figure 13:
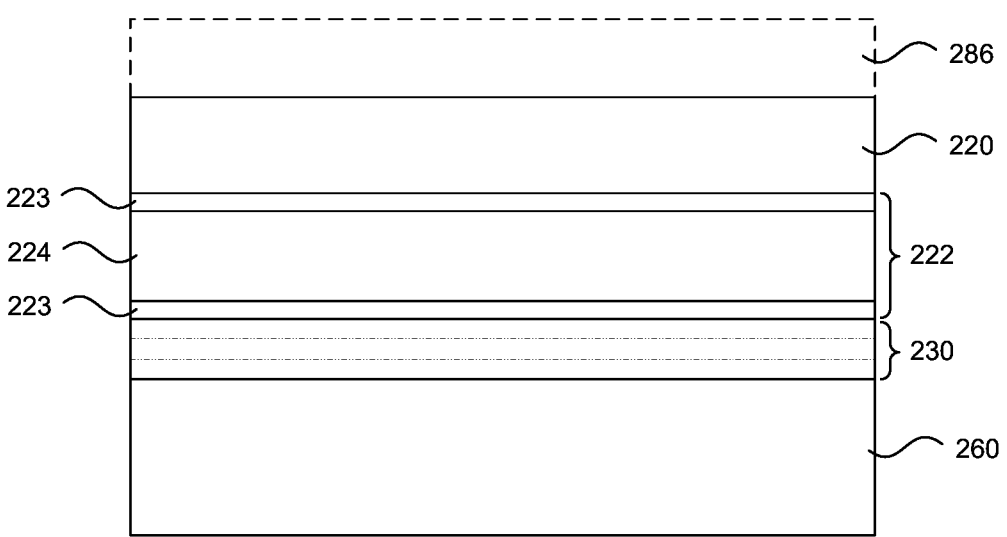
FIG. 13 illustrates an IMC bond between a preformed metal substrate and a light emitting structure according to an embodiment of the present technology.

As shown in FIG. 13, the first portion 295 (FIG. 12) and the second portion 296 (FIG. 12) can be bonded together to form the IMC bond 222 by bringing the first portion 295 and the second portion 296 into contact with one another and subjecting them to heat and/or pressure that causes the first and second portions 295, 296 to bond. The growth substrate 260 and the temporary carrier 286, if present, can be removed using a variety of procedures including back grinding, etching, or chemical-mechanical polishing ("CMP") procedures.

Figure 14:
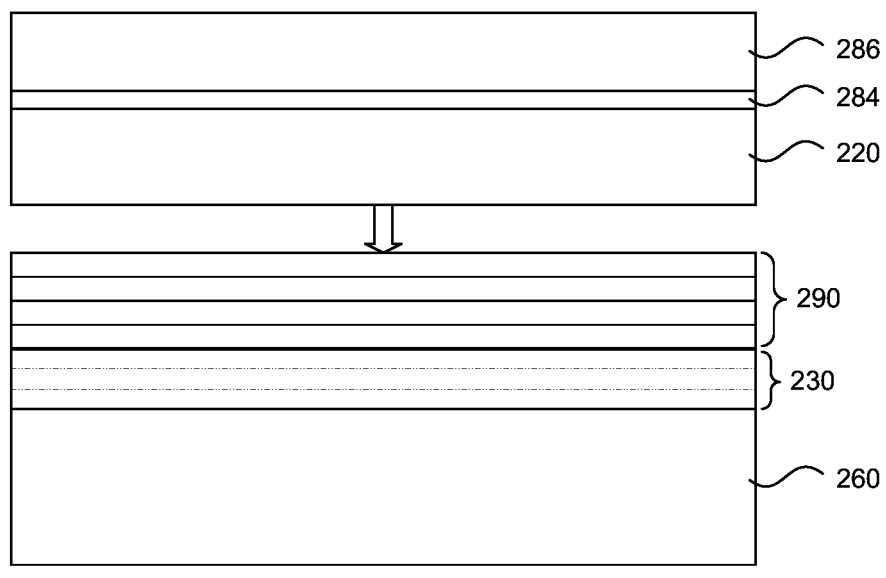
FIG. 14 illustrates a preformed metal substrate being bonded to a light emitting structure, wherein the light emitting structure contains IMC components to form an IMC bond between the preformed metal substrate and the light emitting structure.

FIG. 14 illustrates a further embodiment of the present technology in which the IMC bonding materials 290 are formed on the light emitting structure 230. The process for forming the bonding materials 290 and the eventual IMC bond can be similar to the process described above with reference to FIGS. 10 and 11.

Several embodiments of the wafer 200 made with the techniques described above are less expensive than other processes because, at least in part, the preformed metal substrate 220 can be formed with relatively little expense. The wafers 100, 200 and the SSL devices 110, 210 produced from the wafers 100, 200 are more rigid (less susceptible to bowing) than conventional devices, and the bonded preformed metal substrates 120, 220 also offer excellent thermal and electric conductivity.

From the foregoing, it will be appreciated that specific embodiments of the technology have been described herein for purposes of illustration, but that various modifications may be made without deviating from the technology. In addition, many of the elements of one embodiment may be combined with other embodiments in addition to or in lieu of the elements of the other embodiments. Accordingly, the technology is not limited except as by the appended claims.

I claim:

1. A solid state lighting ("SSL") device, comprising:
a light emitting structure having a first semiconductor material at a first side, a second semiconductor material at a second side opposite the first side, and an active region between the first and second semiconductor materials;
a first contact coupled to the light emitting structure at the first side; and
a second contact coupled to the light emitting structure at the second side, the second contact including:
a preformed metal substrate, wherein the light emitting structure extends continuously over a surface of the preformed metal substrate and has substantially a same footprint as the preformed metal substrate, and
a metal bonding structure bonding the preformed metal substrate to the light emitting structure,
wherein the metal bonding structure comprises a first material and a second material,
wherein a first boundary region of the metal bonding structure adjacent to the preformed metal substrate comprises a first concentration of the first material,
wherein a second boundary region of the metal bonding structure adjacent to the light emitting structure comprises a second concentration of the first material lower than the first concentration, and
wherein a median region disposed between the first boundary region and the second boundary region comprises a third concentration of the first material lower than the first concentration and higher than the second concentration.

2. The SSL device of claim 1, wherein the metal bonding structure is bonded to the preformed metal substrate by an inter-metallic compound (IMC) bond.

3. The SSL device of claim 1, wherein the median region includes a metal alloy comprising the first material and the second material.

4. The SSL device of claim 2, wherein the IMC bond comprises nickel and tin.

5. The SSL device of claim 1, wherein the metal bonding structure is bonded to the preformed metal substrate by a eutectic bond.

6. The SSL device of claim 1, wherein the metal bonding structure is bonded to the preformed metal substrate by a metal-metal bond.

7. The SSL device of claim 6, wherein the metal-metal bond is a copper-copper (Cu-Cu) bond.

8. The SSL device of claim 1, wherein the metal bonding structure includes one or more of a reflective material, a barrier material, or a copper seed layer, and wherein the metal bonding structure extends continuously over the preformed metal substrate.

9. The SSL device of claim 1, further comprising a barrier material between the light emitting structure and the metal bonding structure.

10. The SSL device of claim 1, wherein the preformed metal substrate has a thickness of between 75 μm and 150 μm.

11. A solid state lighting ("SSL") device, comprising:
a light emitting structure having a first semiconductor material at a first side, a second semiconductor material at a second side opposite the first side, and an active region between the first and second semiconductor materials;
a first contact coupled to the light emitting structure at the first side; and
a second contact coupled to the light emitting structure at the second side, the second contact including:
a preformed metal substrate, wherein the light emitting structure extends continuously over a surface of the preformed metal substrate and has substantially a same footprint as the preformed metal substrate, and a metal bonding structure extending continuously over the preformed metal substrate and bonding the preformed metal substrate to the light emitting structure, the metal bonding structure including a first boundary region proximate the preformed metal substrate, a second boundary region proximate the light emitting structure, and a median region between the first and second boundary regions, wherein the median region includes a first concentration of a bonding material, wherein the second boundary region has a second concentration of the bonding material that is less than the first concentration, and wherein the first boundary region has a third concentration of the bonding material that is greater than the first and second concentrations.

12. The SSL device of claim 11, wherein the metal bonding structure forms an inter-metallic compound (IMC) bond between the preformed metal substrate and the light emitting structure.

13. The SSL device of claim 12, wherein the IMC bond comprises nickel and tin.

14. The SSL device of claim 11, wherein the metal bonding structure further includes one or more of a reflective material, a barrier material, or a copper seed layer.

15. The SSL device of claim 11, further comprising a barrier material between the light emitting structure and the metal bonding structure.

16. The SSL device of claim 11, wherein the preformed metal substrate has a thickness of between 75 μm and 150 μm.

* * * * *